(12) United States Patent
Teranishi (10) Patent No.: US 12,507,372 B2
(45) Date of Patent: Dec. 23, 2025

(54) ELECTRONIC CONTROL DEVICE

(71) Applicant: Hitachi Astemo, Ltd., Hitachinaka (JP)

(72) Inventor: Minami Teranishi, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 201 days.

(21) Appl. No.: 18/567,592

(22) PCT Filed: Feb. 7, 2022

(86) PCT No.: PCT/JP2022/004752
§ 371 (c)(1),
(2) Date: Dec. 6, 2023

(87) PCT Pub. No.: WO2022/259610
PCT Pub. Date: Dec. 15, 2022

(65) Prior Publication Data
US 2024/0268060 A1    Aug. 8, 2024

(30) Foreign Application Priority Data
Jun. 9, 2021    (JP) .................... 2021-096382

(51) Int. Cl.
*H05K 7/20* (2006.01)
(52) U.S. Cl.
CPC ..... *H05K 7/20145* (2013.01); *H05K 7/20154* (2013.01); *H05K 7/20409* (2013.01)
(58) Field of Classification Search
CPC ................................... H05K 7/20145
See application file for complete search history.

(56) References Cited

U.S. PATENT DOCUMENTS

| | | | |
|---|---|---|---|
| 6,011,216 A | 1/2000 | Kitahara et al. | |
| 2015/0059388 A1 | 3/2015 | Hirano et al. | |
| 2018/0059165 A1 | 3/2018 | Kakiuchi et al. | |

FOREIGN PATENT DOCUMENTS

| | | |
|---|---|---|
| JP | H03-022555 A | 1/1991 |
| JP | H06-314759 A | 11/1994 |
| JP | H07-038025 A | 2/1995 |
| JP | 2000-214958 A | 8/2000 |
| JP | 2007-142068 A | 6/2007 |

(Continued)

OTHER PUBLICATIONS

English translation of WO 2022018851 A1 (Year: 2022).*

(Continued)

*Primary Examiner* — Mukundbhai G Patel
(74) *Attorney, Agent, or Firm* — Foley & Lardner LLP (57) ABSTRACT

Provided is a cooling technique capable of simultaneously dissipating heat from a plurality of electronic components. An electronic control device includes: a housing including a fin; and a cooling mechanism including a fin cover disposed over the fin to form a flow path for a refrigerant, in which a first electronic component and a second electronic component are in contact with a base surface of the housing via a heat transfer member on a circuit board in the housing, the housing includes a region A having the first electronic component and a region B having the second electronic component, the flow path is longer in the region B than in the region A, the fin cover has a protrusion having a protruding shape on an inner side of the fin cover in the region A, and the flow path is formed in a comb-teeth shape.

19 Claims, 12 Drawing Sheets

(56) References Cited

FOREIGN PATENT DOCUMENTS

| JP | 2011-015454 A | 1/2011 | | |
|----|---------------|--------|---|---|
| JP | 2013-131520 A | 7/2013 | | |
| JP | 2014-220334 A | 11/2014 | | |
| JP | 2015-049747 A | 3/2015 | | |
| JP | 2018-032710 A | 3/2018 | | |
| JP | 2019-047028 A | 3/2019 | | |
| WO | WO-2015/198642 A1 | 12/2015 | | |
| WO | WO-2021053907 A1 * | 3/2021 | ......... | H05K 7/20863 |
| WO | WO-2022018851 A1 * | 1/2022 | ............... | H05K 7/20 |

OTHER PUBLICATIONS

English translation of WO 2021053907 A1 (Year: 2021).*
International Preliminary Report on Patentability issued in corresponding International Application No. PCT/JP2022/004752, dated Dec. 21, 2023 (7 pages).
International Search Report with English Translation of International Patent Application No. PCT/JP2022/004752 dated Apr. 19, 2022 (6 pages).
Japanese Office Action issued in corresponding JP Application No. 2021-096382, dated Dec. 3, 2024 with English translation (4 pages).

* cited by examiner

$9a \geq 9b$

$$\Delta P_{loss} = \zeta \cdot \frac{\rho}{2} \cdot u^2 \quad \text{130}$$

$$\zeta = f \cdot \frac{L}{de} \quad \text{131}$$

$$f = \frac{0.3164}{Re^{0.25}} \quad \text{132}$$

$\zeta$: PRESSURE LOSS COEFFICIENT
$\rho$: DENSITY OF FLUID [kg/m³]
$u$: AVERAGE FLOW RATE [m/s]
$L$: FLOW PATH LENGTH [m]
$de$: EQUIVALENT DIAMETER [m]
$f$: FRICTION COEFFICIENT

| | A (50×63mm) | B (50×143mm) | PRESSURE LOSS BETWEEN FINS ($\Delta P$) |
|---|---|---|---|
| 100R | | | REGION A = 5.8 Pa<br>REGION B = 13.2 Pa<br>ABOUT 2.3 TIMES |
| 100 | | | REGION A = 15.3 Pa<br>REGION B = 13.2 Pa<br>ABOUT 0.9 TIMES |

*FIG. 17*

|  |  | L | de | Re | f | ξ | u | ΔP |
|---|---|---|---|---|---|---|---|---|
| 100R | REGION A | 0.063 | 0.00913 | 2696 | 0.0439 | 0.3029 | 6.25 | 5.8 |
| | REGION B | 0.143 | 0.00913 | 2696 | 0.0439 | 0.6875 | 6.25 | 13.2 |
| 100 | REGION A | 0.063 | 0.00452 | 1397 | 0.0518 | 0.7220 | 6.55 | 15.3 |
| | REGION B | 0.143 | 0.00913 | 2696 | 0.0439 | 0.6875 | 6.25 | 13.2 |

ELECTRONIC CONTROL DEVICE

TECHNICAL FIELD

The present disclosure relates to an electronic control device, and particularly to a technique effective to be applied to an electronic control device including a plurality of semiconductor elements that generate heat.

BACKGROUND ART

Electronic control devices (also referred to as ECUs) for engine control, motor control, automatic transmission control, and the like are disposed in vehicles such as automobiles, for example. Some electronic control devices include a device having a semiconductor element (IC) that generates high heat. Such an electronic component such as a semiconductor element that generates high heat is usually disposed between a circuit board (also referred to as a printed board) and a housing having heat dissipation fins. There is known a structure in which a housing is formed of a material having high thermal conductivity such as metal, and an air cooling fan causes cooling air as a refrigerant to flow between heat dissipation fins disposed in the housing to cool heat generated in an electronic component.

As a proposal for cooling an electronic component such as a semiconductor element, there are JP 2013-131520 A, JP 2019-47028 A, JP 06-314759 A, JP 2018-32710 A, and the like.

CITATION LIST

Patent Literatures

PTL 1: JP 2013-131520 A
PTL 2: JP 2019-47028 A
PTL 3: JP 06-314759 A
PTL 4: JP 2018-32710 A

SUMMARY OF INVENTION

Technical Problem

In order to implement each of ECUs for high-performance autonomous driving (AD) and an advanced driver-assistance system (ADAS), a plurality of high-heat generating ICs may be mounted on a printed board of the ECU. It has been found that, in a case where the plurality of ICs are cooled by one cooling fan, inter-fin flow paths (pressure losses) are different depending on a positional relationship between each IC and the fan and the shape of the housing, and thus the heat dissipation is uneven in the plurality of ICs.

For cost reduction, ADC (aluminum die cast) integral molding may be used for a heat dissipation fin. In this case, it has been found that the inter-fin flow paths cannot be narrowed due to design constraints, and the heat dissipation is reduced in the plurality of ICs.

An object of the present disclosure is to provide a cooling technique capable of simultaneously dissipating heat from a plurality of electronic components.

Other problems and novel features will become apparent from the description of the present specification and the accompanying drawings.

Solution to Problem

An outline of representative ones of the present disclosure will be briefly described below.

According to one embodiment, an electronic control device includes: a housing including a fin; and a cooling mechanism including a fin cover disposed over the fin to form a flow path for a refrigerant, in which a first electronic component and a second electronic component are in contact with a base surface of the housing via a heat transfer member on a circuit board in the housing, the housing includes a region A having the first electronic component and a region B having the second electronic component, the flow path is longer in the region B than in the region A, the fin cover has a protrusion having a protruding shape on an inner side of the fin cover in the region A, and the flow path is formed in a comb-teeth shape.

Advantageous Effects of Invention

According to the above embodiment, it is possible to provide a cooling technique capable of simultaneously dissipating heat from a plurality of electronic components without unevenness in heat dissipation.

Problems, configurations, and effects other than those described above will be clarified by the following description of embodiments for carrying out the invention.

DESCRIPTION OF EMBODIMENTS

Hereinafter, embodiments of the present invention will be described with reference to the drawings. The following description and drawings are examples for describing the present invention, and omission and simplification are made as appropriate for the sake of clarity of description. The present invention can be carried out in various other forms. Unless otherwise specified, each component may be singular or plural.

Positions, sizes, shapes, ranges, and the like of components illustrated in the drawings may not represent actual positions, sizes, shapes, ranges, and the like in order to facilitate understanding of the invention. Therefore, the present invention is not necessarily limited to the positions, sizes, shapes, ranges, and the like disclosed in the drawings.

In a case where there are a plurality of components having the same or similar functions, the same reference signs may be attached with different subscripts for description. However, in a case where it is not necessary to distinguish the plurality of components, the description may be made while omitting the subscripts.

Embodiments

Figure 1:
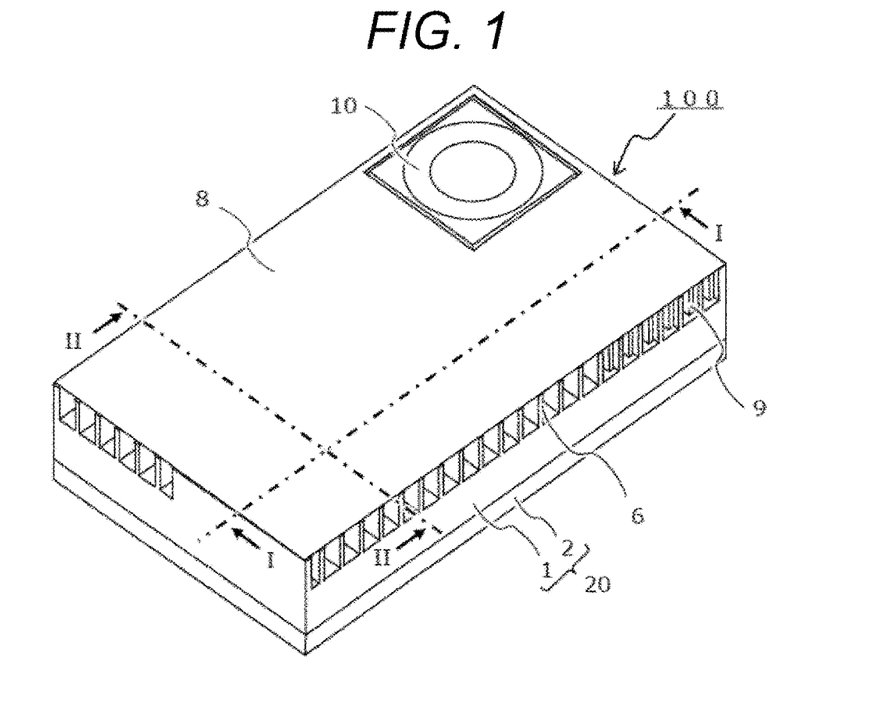
FIG. 1 is an external perspective view of an electronic control device according to an embodiment.
Figure 2:
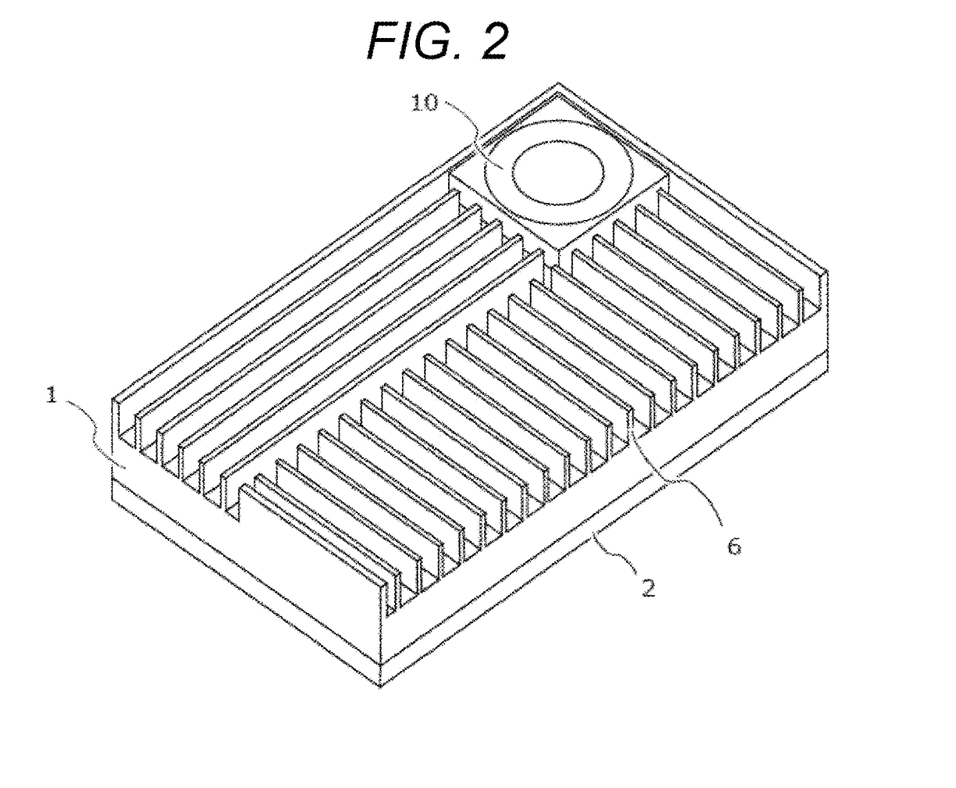
FIG. 2 is an external perspective view illustrating a fin cover of the electronic control device illustrated in FIG. 1.
Figure 3:
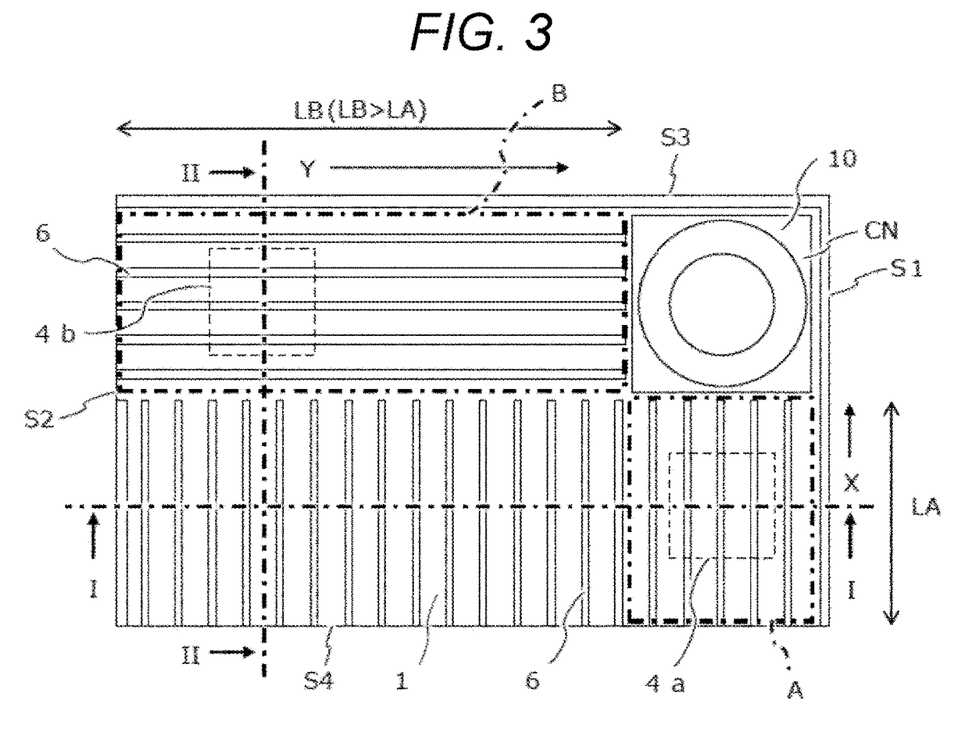
FIG. 3 is a top view of the electronic control device illustrated in FIG. 2.
Figure 4:
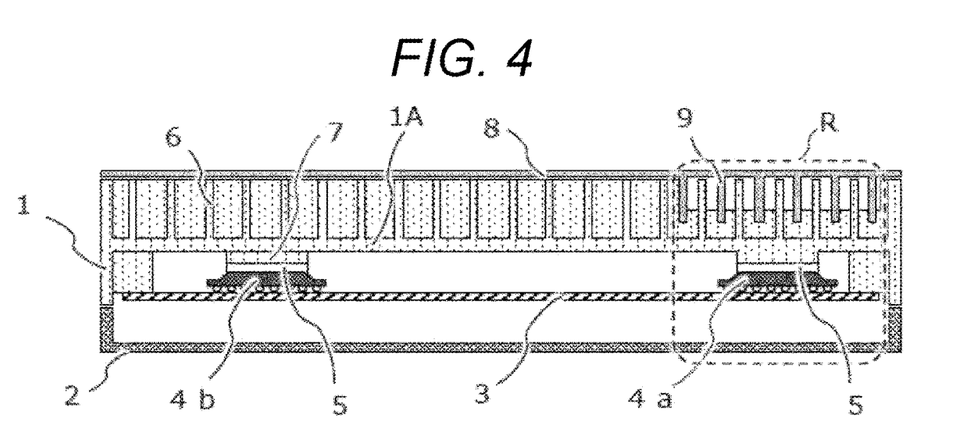
FIG. 4 is a cross-sectional view of the electronic control device, taken along line I-I illustrated in FIG. 1.
Figure 5:
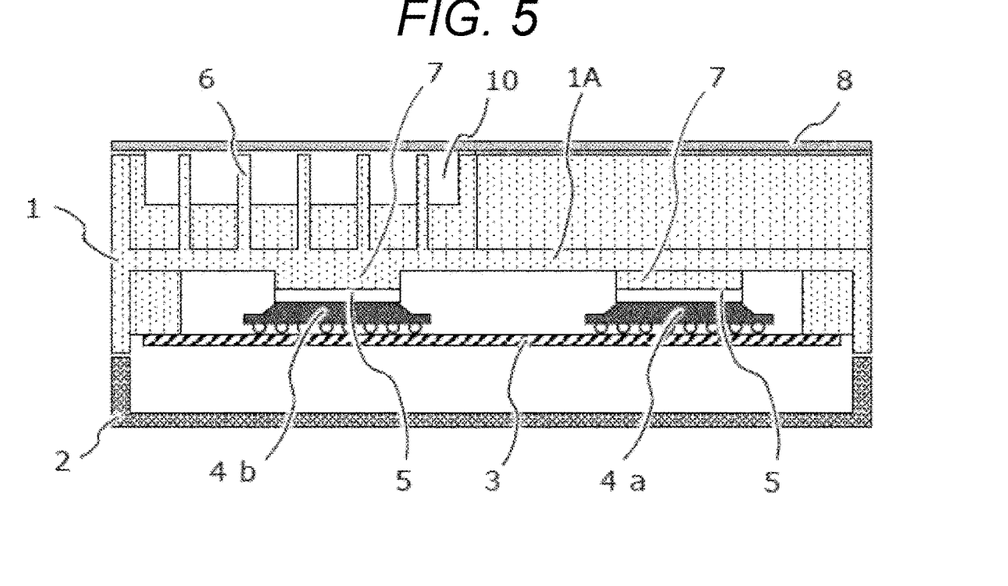
FIG. 5 is a cross-sectional view of the electronic control device, taken line II-II along illustrated in FIG. 1.
Figure 6:
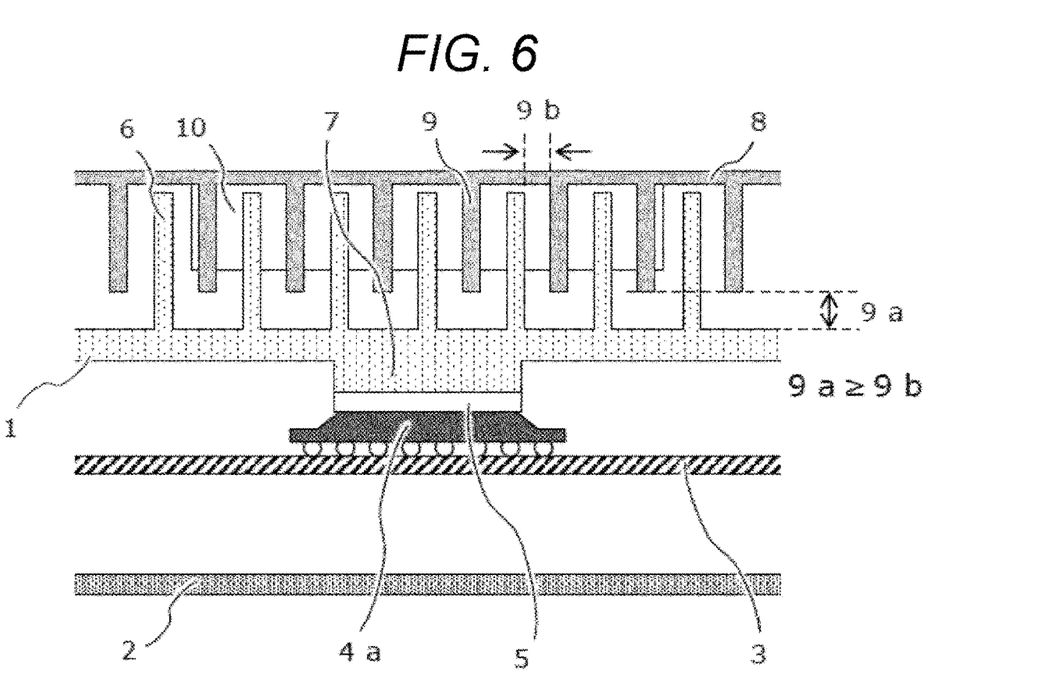
FIG. 6 is an enlarged view of an R portion of the electronic control device illustrated in FIG. 4, and is a cross-sectional view for explaining a fin cover according to a first configuration example.
Figure 7:
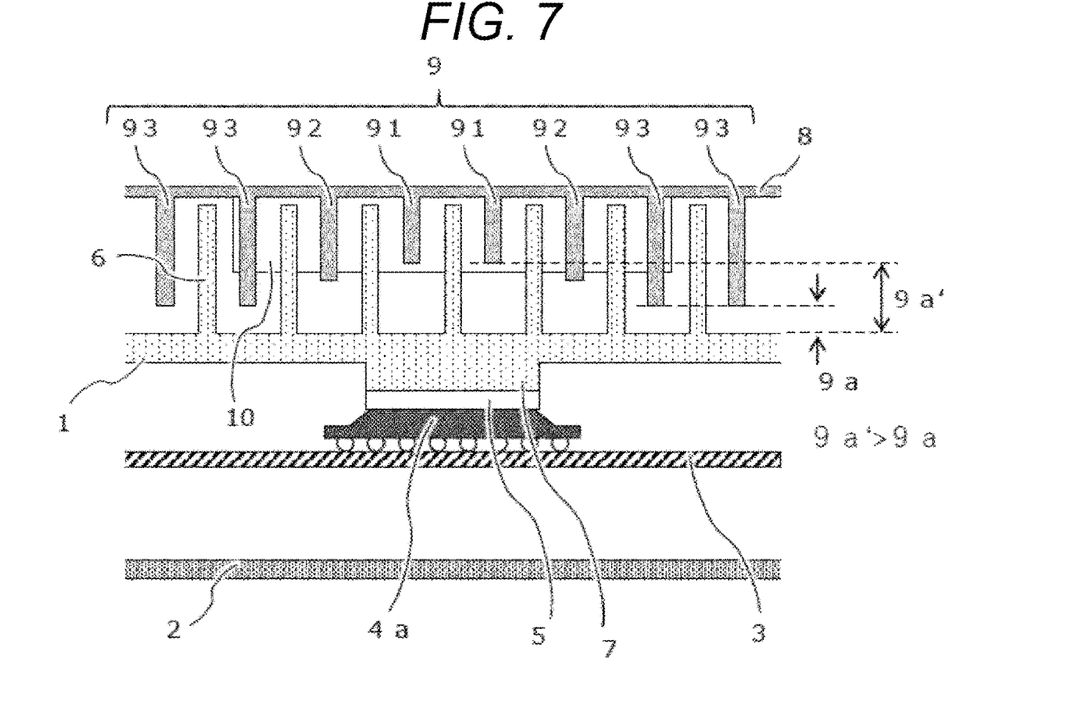
FIG. 7 is an enlarged view of the R portion of the electronic control device illustrated in FIG. 4, and is a cross-sectional view for explaining a fin cover according to a second configuration example.

Embodiments will be described below with reference to FIGS. 1 to 7. FIG. 1 is an external perspective view of an electronic control device according to an embodiment. FIG. 2 is an external perspective view illustrating a fin cover of the electronic control device illustrated in FIG. 1. FIG. 3 is a top view of the electronic control device illustrated in FIG. 2. FIG. 4 is a cross-sectional view of the electronic control device, taken along line I-I illustrated in FIG. 1. FIG. 5 is a cross-sectional view of the electronic control device, taken along line II-II illustrated in FIG. 1. FIG. 6 is an enlarged view of an R portion of the electronic control device illustrated in FIG. 4, and is a cross-sectional view for explaining a fin cover according to a first configuration example. FIG. 7 is an enlarged view of the R portion of the electronic control device illustrated in FIG. 4, and is a cross-sectional view for explaining a fin cover according to a second configuration example.

The electronic control device 100 includes a housing 20 including an upper housing 1 and a lower housing 2, a fin cover 8 provided to cover an upper side of heat dissipation fins 6 disposed in the upper housing 1, and an air cooling fan 10 for cooling attached to the upper housing 1. The housing has a forced air cooling structure including the air cooling fan 10. The air cooling fan 10 can be regarded as a refrigerant circulation device for circulating air as a refrigerant.

The upper housing 1 and the lower housing 2 are fixed by a fastening member such as a screw (not illustrated). A circuit board (substrate) 3, a plurality of electronic components 4 (see FIGS. 3 and 4: a first electronic component 4a and a second electronic component 4b) including semiconductor elements such as a data processing device and a microprocessor, a heat transfer material (heat transfer portion) 5 such as grease, and the like are accommodated in the housing. As illustrated in FIGS. 1 and 4, in a part of the fin cover 8, a plurality of protrusions 9 formed downward and having a protruding shape are disposed on the inner side (lower side). The plurality of protrusions 9 have a structure having a comb-teeth-shaped series of parallel protrusions 9, and is configured such that one protrusion 9 is disposed between a pair (two) of fins 6.

The upper housing 1 is made of a metal material having excellent thermal conductivity, such as aluminum (for example, ADC 12). The upper housing 1 is formed of a sheet metal such as iron or a nonmetallic material such as a resin material or CFRP, and thus it is possible to achieve cost reduction and weight reduction. As illustrated in FIGS. 1, 2, and 4, the upper housing 1 is formed in a box shape having a side wall around the upper housing 1 and having a lower surface side (circuit board 3 side) opened. The upper housing 1 is provided with a plurality of boss portions 7 protruding toward the circuit board 3 (see FIG. 4). The circuit board 3 is fixed to the upper housing 1 with a screw (not illustrated). The plurality of plate-shaped heat dissipation fins 6 protruding upward are disposed on the upper surface of the upper housing 1. The heat dissipation fins 6 and the boss portions 7 are integrally formed with the upper housing 1 by casting such as die casting. However, the heat dissipation fins 6 and the boss portions 7 may be manufactured as separate members from the upper housing 1 and attached to the upper housing.

As illustrated in FIG. 4, the electronic components 4a and 4b are mounted on the circuit board 3, and the boss portions 7 protruding toward the circuit board 3 are formed on an upper inner surface of the upper housing 1. The heat transfer material (heat transfer member) 5 is disposed between the boss portions 7 of the upper housing 1 and the electronic components 4a and 4b, and the electronic components 4a and 4b are in contact with the lower side (lower surface) of a base surface 1A of the upper housing 1 via the heat transfer material 5. As a result, heat of the electronic components 4a and 4b can be dissipated from the heat dissipation fins 6 disposed on the upper side (upper surface) of the base surface 1A of the upper housing 1 through the heat transfer material 5 and the boss portions 7.

Similarly to the upper housing 1, the lower housing 2 is formed of a metal material having excellent thermal conductivity such as aluminum. Similarly to the upper housing 1, the lower housing 2 is formed of a sheet metal such as iron or a non-metallic material such as a resin material, and thus it is possible to achieve cost reduction and weight reduction.

Similarly to the upper housing 1, the fin cover 8 is made of a metal material having excellent thermal conductivity such as aluminum. Similarly to the upper housing 1, the fin cover 8 is formed of a sheet metal such as iron or a non-metallic material such as a resin material, and thus it is possible to achieve cost reduction and weight reduction. The fin cover 8 is disposed over the fins 6 and constitutes a cooling mechanism for forming a refrigerant flow path.

As illustrated in FIGS. 1, 2, and 3, the housing 20 (upper housing 1 and lower housing 2) of the electronic control device 100 has a rectangular shape as viewed from above (in top view). In this example, the housing 20 (upper housing 1 and lower housing 2) has a rectangular shape having four sides. As illustrated in FIG. 3, the housing 20 (upper housing 1 and lower housing 2) has a first side S1, a second side S2 opposite to the first side S1, a third side S3 disposed between the first side S1 and the second side S2, and a fourth side S4 opposite to the third side S3. In the example of FIG. 3, the length of the first side S1 is equal to the length of the second side S2, and is shorter than the lengths of the third side S3 and the fourth side S4. In other words, the length of the third side S3 is equal to the length of the fourth side S4, and is longer than the lengths of the first side S1 and the second side S2. The first side S1 and the second side S2 extend in a first direction X, and the third side S3 and the fourth side S4 extend in a second direction Y different from the first direction X.

The cooling fan 10 has a rectangular shape as viewed from above. In the examples illustrated in FIGS. 1, 2, and 3, the cooling fan 10 has a square shape as viewed from above. The cooling fan 10 is mounted in one corner region of the rectangular upper housing 1, that is, in a corner region CN where the first side S1 and the third side S3 intersect. The fan 10 is used to simultaneously cool the two electronic s 4a and 4b using air as a refrigerant. Cooling air for the electronic component 4a flows a first path length of a distance LA in the first direction X (also referred to as a first flow path direction) in a region A (also referred to as a first region) based on a forming direction of the plurality of heat dissipation fins 6 disposed on the upper side of the electronic component 4a. Cooling air for electronic component 4b flows a path length of a distance LB longer than the distance LA in the second direction Y (also referred to as a second flow path direction Y) different from the first direction X in a region B (also referred to as a second region) based on a forming direction of the plurality of heat dissipation fins disposed on the upper side of the electronic component 4b (LB>LA). Here, it can be said that the distance LA corresponds to a length of each of the heat dissipation fins 6 in the region A, and the distance LB corresponds to a length of each of the heat dissipation fins 6 in the region B. In the example illustrated in FIG. 3, the first direction X and the second direction Y are directions intersecting with each other, and more specifically, the first direction X and the second direction Y are directions orthogonal to each other.

In other words, in the housing 20, the fan 10 and the region A are arranged along the first side S1 of the housing 20, and the fan 10 and the region B are arranged along the third side S3 of the housing 20 as viewed from above. The region A has the plurality of heat dissipation fins 6 for cooling the electronic component 4a. The plurality of heat dissipation fins 6 formed in the region A are disposed in parallel to the first side S1 and extend in the first direction X. Each of the plurality of heat dissipation fins 6 formed in the region A has the path length of the distance LA. The region B has the plurality of heat dissipation fins 6 for cooling the electronic component 4b. The plurality of heat dissipation fins 6 formed in the region B are disposed in parallel to the third side S3 and extend in the second direction Y. Each of the plurality of heat dissipation fins 6 formed in the region B has the path length of the distance LB longer than the distance LA.

As illustrated in FIG. 4, the plurality of protrusions 9 having the protruding shape are disposed on a portion of the fin cover 8 located on the upper side of the electronic component 4a, and the protrusions 9 having the protruding shape disposed on the fin cover 8 are disposed between the plurality of heat dissipation fins 6 disposed on the upper side of the electronic component 4a. Meanwhile, as illustrated in FIG. 5, since the plurality of protrusions 9 having the protruding shape are not disposed on a portion of the fin cover 8 located on the upper side of the electronic component 4b, a protrusion 9 is not disposed between the plurality of heat dissipation fins 6 disposed on the upper side of the electronic component 4b.

A cross section of a flow path in the region A will be described with reference to FIG. 6. As described above, the fin cover 8 has the plurality of protrusions 9 having the protruding shape on the inner side (lower side) of the fin cover 8 in the region A, and a comb-teeth-shaped flow path through which air as a refrigerant flows is formed. The area of a cross section of one flow path in the region A is an area obtained by subtracting the area of a protrusion 9 from the area of a region surrounded by a pair of fins 6 and 6, the lower surface of the fin cover 8, and the upper surface of the base surface 1A of the upper housing 1. In the cross section of the one flow path in the region A, a length $9a$ of a gap between the root of the fin 6 (the upper surface of the upper housing 1 where the fin 6 is not formed) and the tip of the protrusion 9 is larger than a length $9b$ of a gap between a side surface of the fin 6 parallel to the flow path direction and a side surface of the protrusion 9 ($9a>9b$). The lengths $9a$ and $9b$ of the gaps may be equal ($9a=9b$). That is, the relationship between the lengths $9a$ and $9b$ of the gaps may be $9a \geq 9b$. By setting $9a>9b$, air can flow more efficiently into the gap between the root of the fin 6 and the tip of the protrusion 9, and thus the heat dissipation of the electronic component 4a can be improved.

On the other hand, as illustrated in FIG. 5, the area of a cross section of one flow path in the region B is a region surrounded by a pair of fins 6 and 6, the lower surface of the fin cover 8, and the upper surface of the base surface 1A of the upper housing 1 since a protrusion 9 is not disposed on the inner side (lower side) of the fin cover 8 in the region B.

Therefore, the area of a cross section of one flow path in the region A is smaller than the area of a cross section of one flow path in the region B by the area of the protrusion 9. As a result, it is possible to increase a pressure loss in the region A and reduce a difference in pressure loss between the region A and the region B without changing surface areas of the fins 6. Thus, the heat dissipation of the second electronic component 4b can be improved. In addition, in the region A, since the cooling air actively flows to the roots of the fins 6 close to the electronic component 4a as a heat source, heat dissipation can be improved. In other words, in inter-fin flow paths formed above each of the electronic components 4a and 4b, the protrusions 9 having the protruding shape form a comb-teeth-shaped flow path on the inner side of the fin cover 8 in the region A (region of the electronic component 4a) where flow path is short, and thus it t is possible to reduce the difference in pressure loss from the region B (region of the electronic component 4b) where the flow path is long. As a result, in the electronic components 4a and 4b, it is possible to simultaneously and efficiently dissipate heat from the electronic components 4a and 4b while preventing unevenness in heat dissipation.

Next, vertical lengths of the plurality of protrusions 9 disposed on the fin cover will be described with reference to FIGS. 6 and 7.

FIG. 6 illustrates a first configuration example of the plurality of protrusions 9, and the lengths of the protrusions 9 are equal. Therefore, regarding each protrusion 9, the lengths $9a$ of the gaps between the roots of the fins 6 (the upper surface of the upper housing 1 where the fins 6 are not formed) and the tips of the protrusions 9 are equal.

Meanwhile, FIG. 7 illustrates a second configuration example of the plurality of protrusions 9, and a plurality of protrusions 9 (91, 92, and 93) are configured to have different lengths. In FIG. 7, the two protrusions 91 disposed on the upper side of the electronic component 4a have the shortest length. The length of each of the protrusions 92 disposed on the left and right of the protrusions 91 is longer than the length of each of the protrusions 91, and the length of each of the protrusions 93 disposed adjacent to the protrusions 92 is longer than the length of each of the protrusions 92. That is, a length $9a'$ of a gap between the root of the fin 6 (the upper surface of the upper housing 1 where the fin 6 is not formed) and the tip of the protrusion 91 is longer than the length 9a of the gap between the root of the fin 6 (the upper surface of the upper housing 1 where the fin 6 is not formed) and the tip of the protrusion 93 (9a'>9a). Therefore, in the region A, a flow path disposed at a position away from immediately above (or above) the electronic component 4a has a longer protrusion 9 (the area of a cross section of the flow path is small) than that of a flow path disposed at a position immediately above (or above) the electronic component 4a. As a result, since cooling air actively flows in the flow path between the fins 6 above the electronic component 4a, the heat dissipation is improved.

Figure 8:
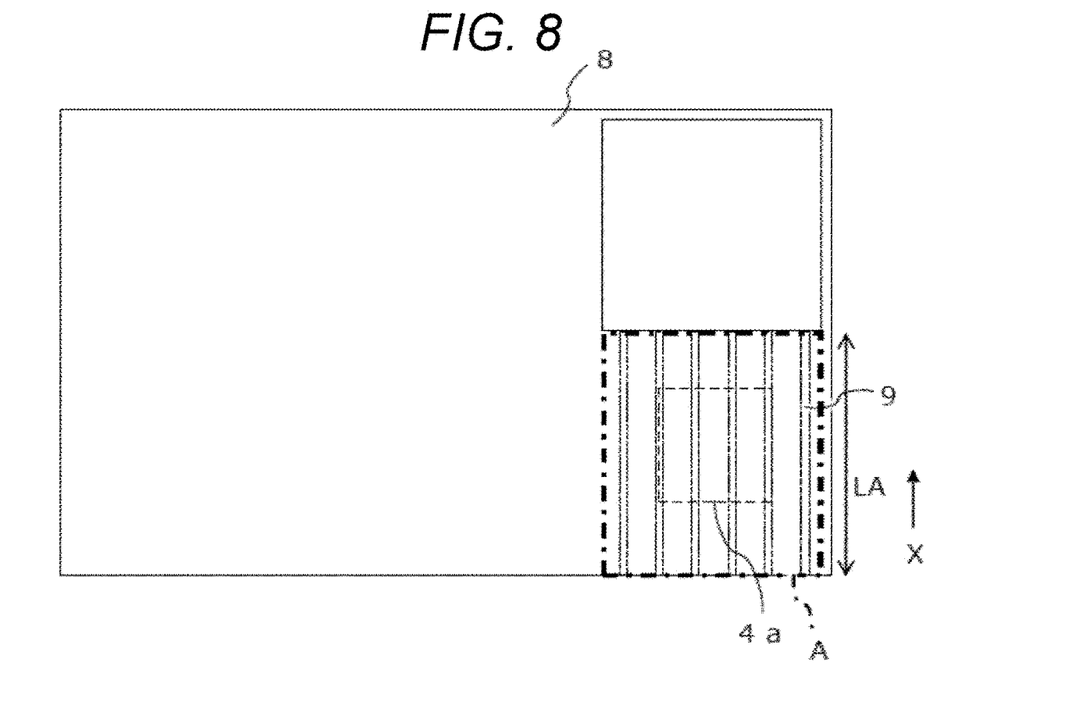
FIG. 8 is a top view of the fin cover of the electronic control device illustrated in FIG. 1.
Figure 9:
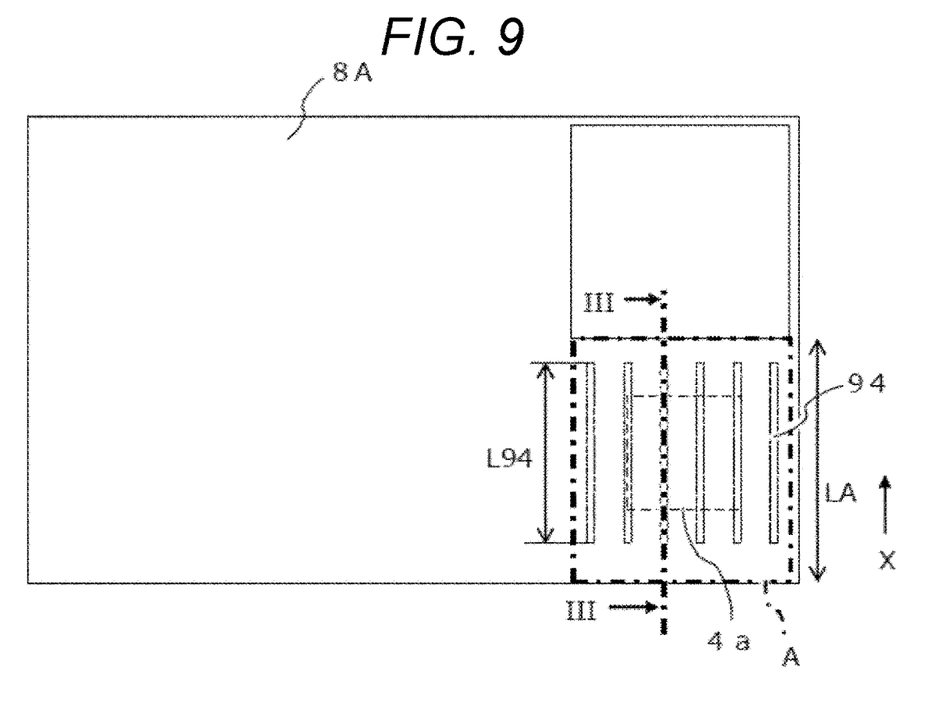
FIG. 9 is a top view of a modification of the fin cover of the electronic control device illustrated in FIG. 1.
Figure 10:
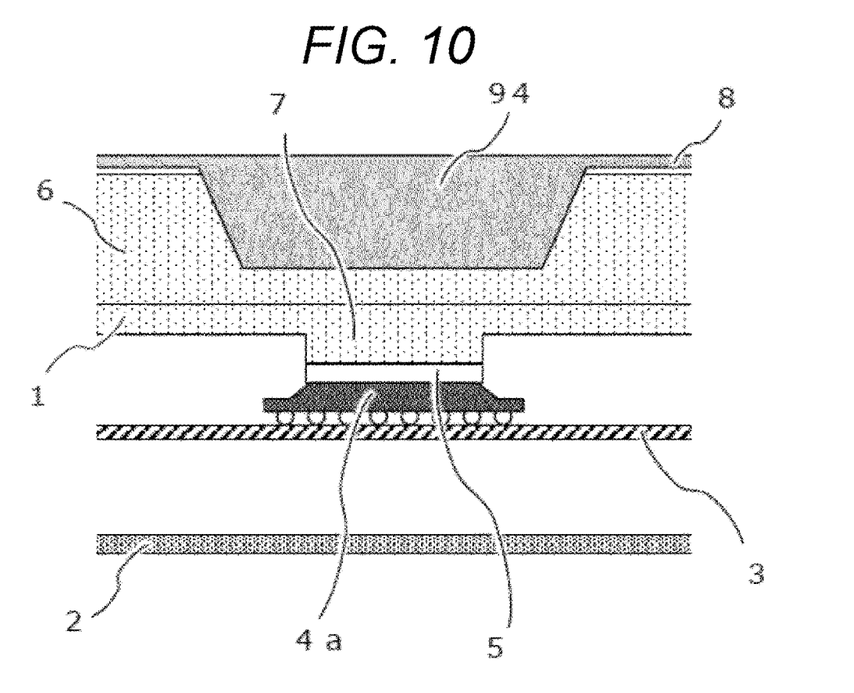
FIG. 10 is a cross-sectional view illustrating an electronic control device to which a fin cover illustrated in FIG. 9 is attached, taken along line III-III illustrated in FIG. 9.

Next, lengths of the plurality of protrusions disposed on the fin cover in top view will be described with reference to FIGS. 8, 9, and 10. FIG. 8 is a top view of the fin cover of the electronic control device illustrated in FIG. 1. FIG. 9 is a top view illustrating a modification of the fin cover of the electronic control device illustrated in FIG. 1. FIG. 10 is a cross-sectional view illustrating an electronic control device to which a fin cover illustrated in FIG. 9 is attached, taken along line III-III illustrated in FIG. 9.

As illustrated in FIG. 8, each of the plurality of protrusions 9 disposed on the fin cover 8 is disposed in the region A and has a length of a distance LA in the first direction X in top view (plan view).

Meanwhile, as illustrated in FIG. 9, each of a plurality of protrusions 94 disposed on a fin cover 8A according to the modification has a length of a distance L94 shorter than the distance LA in the first direction X in top view (plan view) (L94<LA). That is, when viewed from above, the protrusions 94 are formed at least in a region where the electronic component 4a is disposed. As illustrated in FIG. 10, in the region A, the protrusions 94 having an inverted trapezoidal protruding shape are formed at least in a flow path immediately above the electronic component 4a. By providing the protrusions 94 having the protruding shape only on the upper side of the region where the electronic component 4a is disposed, the cross-sectional area of a flow path on the upper side of the region where the electronic component 4a is disposed can be reduced, and the flow rate of cooling air in a flow path immediately above the electronic component 4a can be locally increased. Accordingly, heat dissipation can be improved.

FIG. 10 illustrates a configuration example in which the protrusions 94 having the protruding shape are disposed in the entire region on the upper side of the electronic component 4a, but the present invention is not limited thereto. The protrusions 94 having the protruding shape may be disposed on at least a part of the upper side of the electronic component 4a. Also with this configuration, the heat dissipation can be improved as described above.

Figure 13:
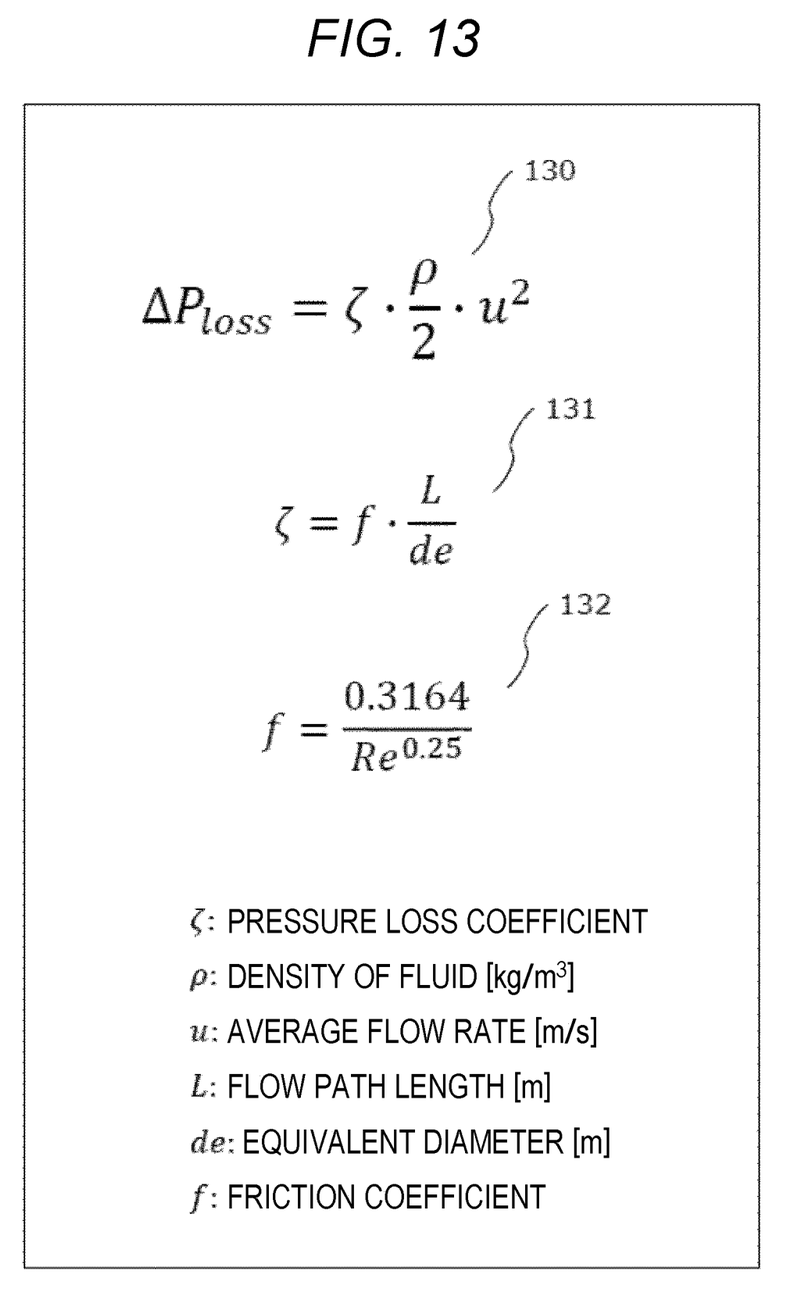
FIG. 13 is a diagram illustrating an equation of a pressure loss used for simulation.
Figure 14:
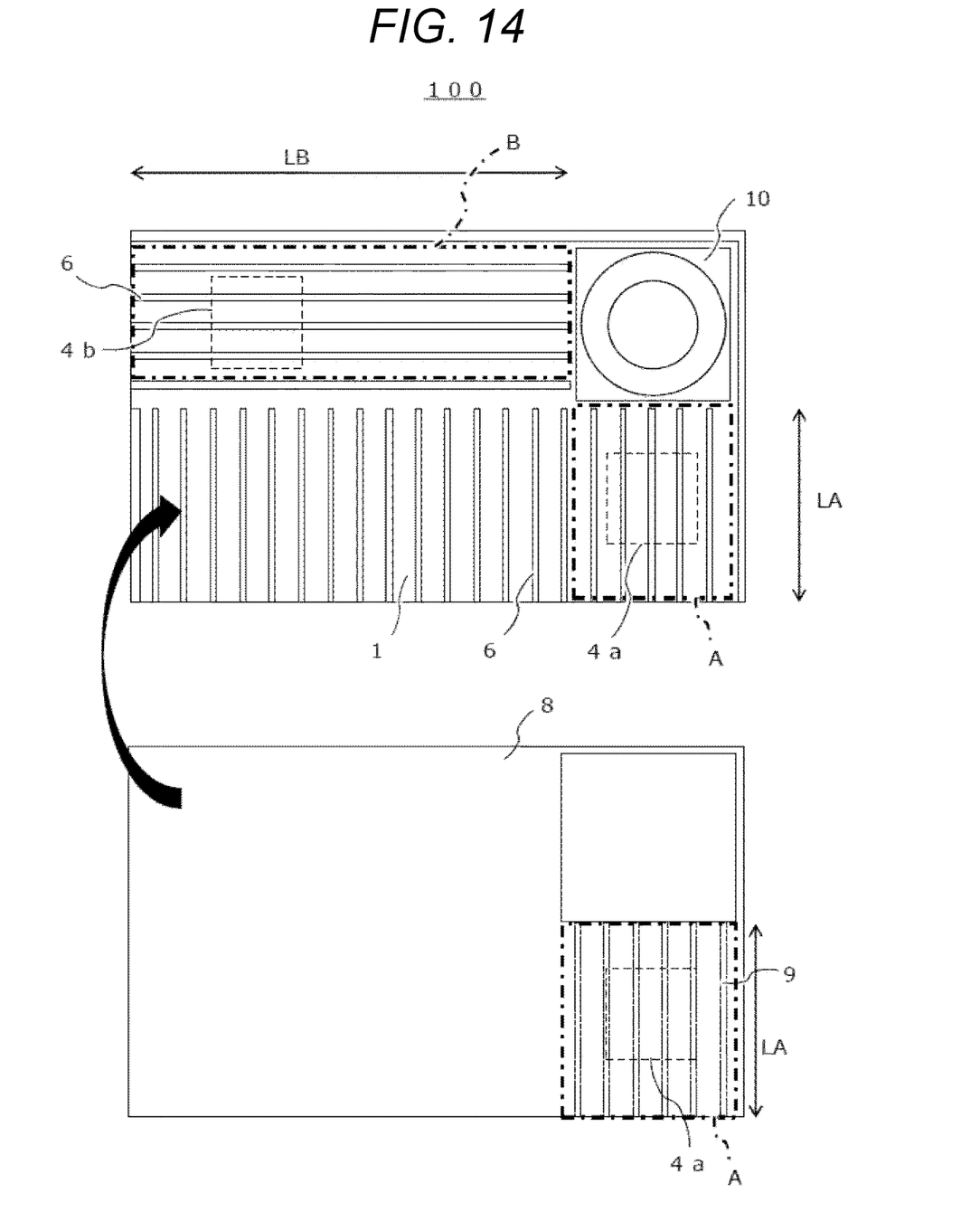
FIG. 14 is an explanatory diagram of the electronic control device according to the embodiment used for simulation.
Figure 15:
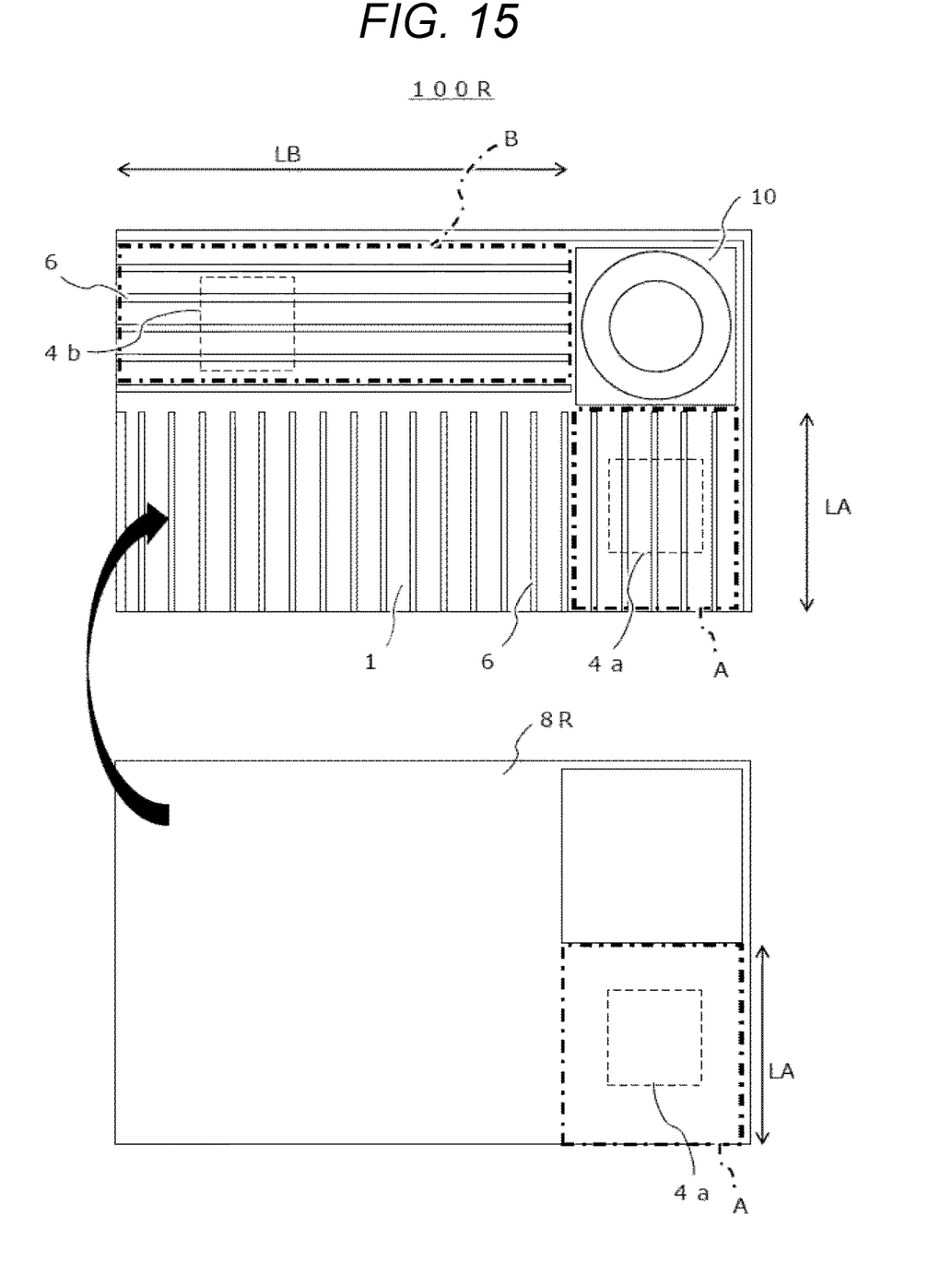
FIG. 15 is an explanatory diagram of an electronic control device according to a comparative example used for the simulation.
Figure 16:
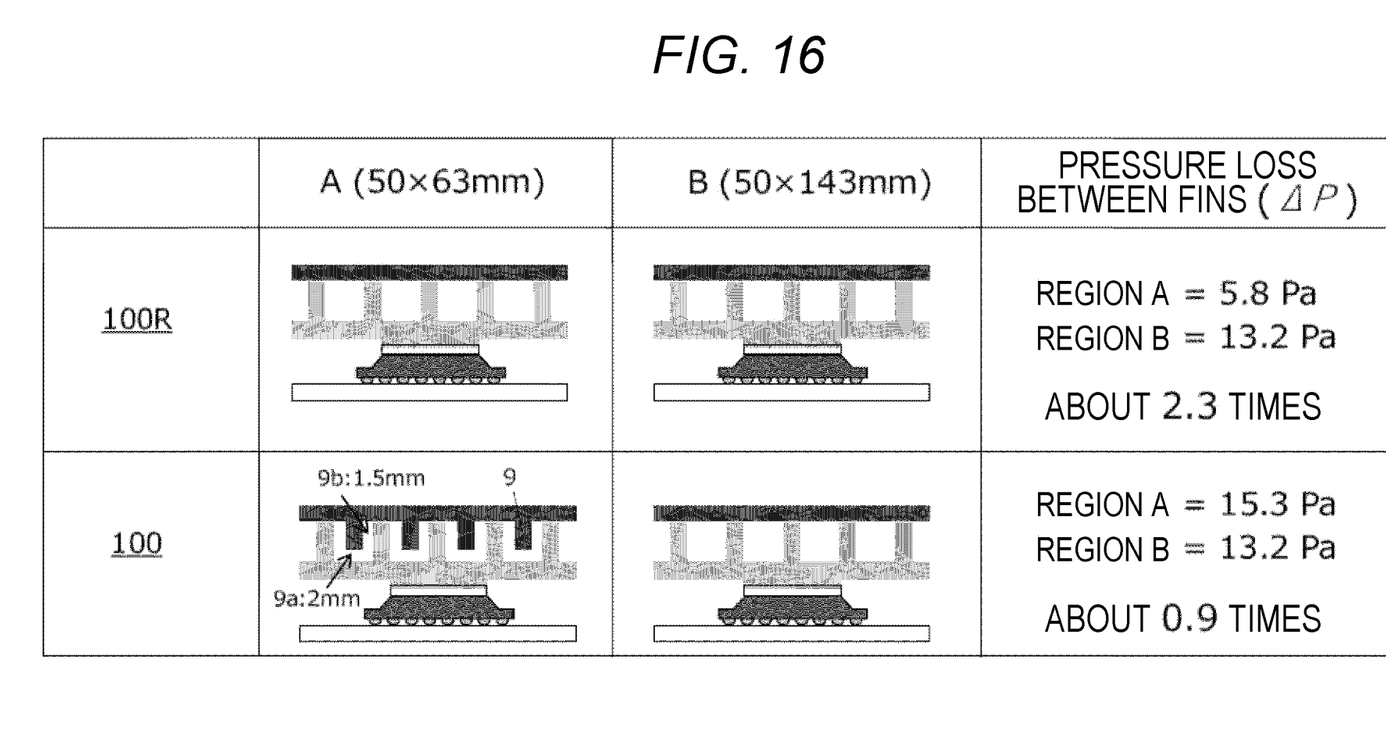
FIG. 16 is a comparative diagram for explaining simulation results.
Figure 17:
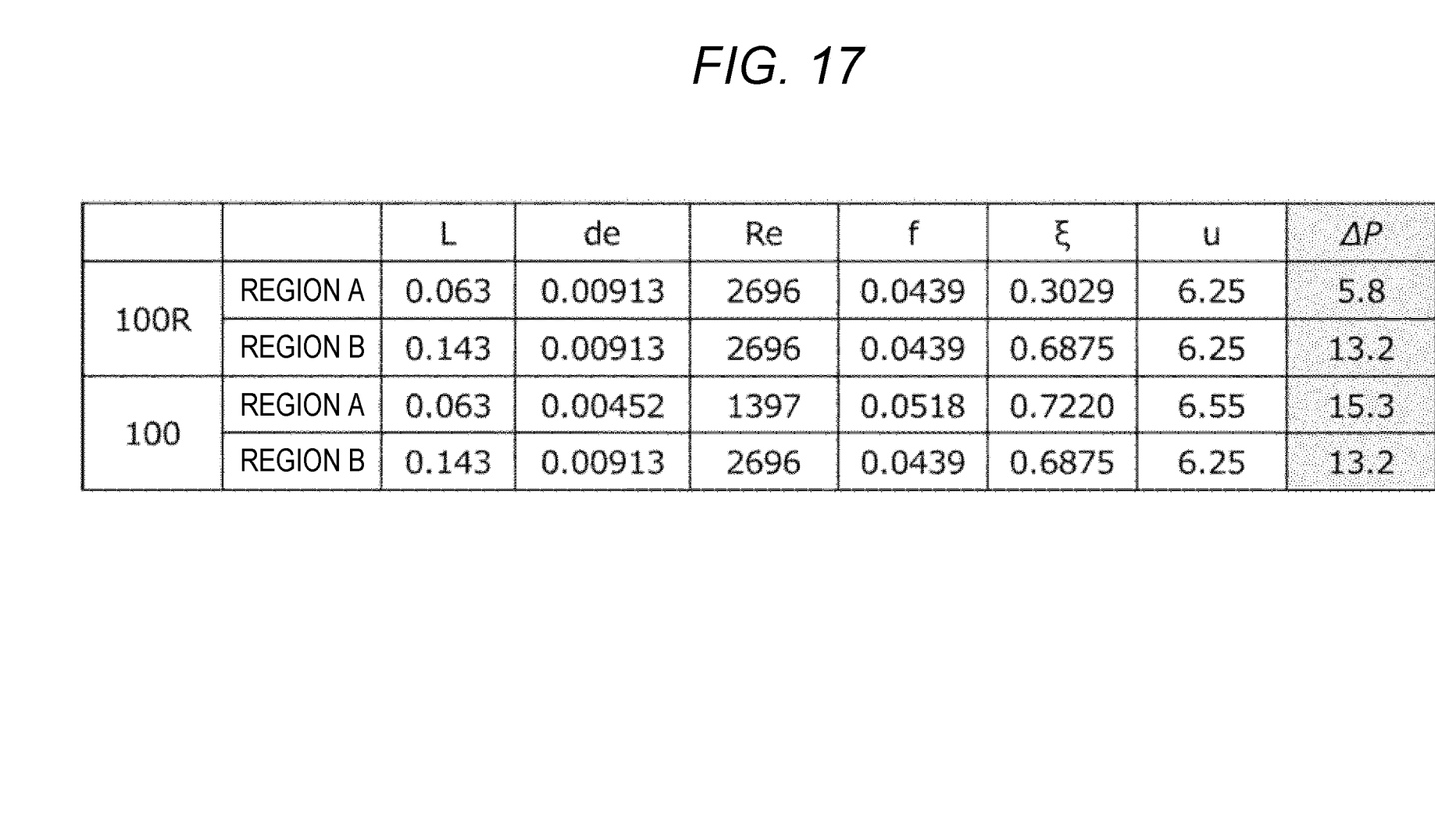
FIG. 17 is a diagram illustrating a specific numerical example of the simulation results.

Next, simulation of pressure losses will be described with reference to FIGS. 13 to 17. FIG. 13 is a diagram illustrating an equation of a pressure loss used for the simulation. FIG. 14 is an explanatory diagram of the electronic control device according to the embodiment used for simulation. FIG. 15 is an explanatory diagram of an electronic control device according to a comparative example used for the simulation. FIG. 16 is a comparative diagram for explaining simulation results. FIG. 17 is a diagram illustrating a specific numerical example of the simulation results.

A pressure loss ($\Delta P_{loss}$) is a frictional pressure loss due to friction generated between fluid (air) and flow path wall surfaces (fins 6) when the air as a refrigerant from a fan 10 passes between fins 6, and is expressed by Equations 130, 131, and 132 illustrated in FIG. 13. In the simulation of the pressure loss, these equations were used.

FIG. 14 illustrates the electronic control device 100 according to the embodiment used for the simulation, and the electronic control device 100 has a configuration in which the upper housing 1 as described in FIG. 3 is covered with the fin cover 8 having the plurality of protrusions 9 as described in FIG. 8. FIG. 15 illustrates the electronic control device 100R according to the comparative example used for the simulation, and has a configuration in which an upper housing 1 as described in FIG. 3 is covered with a fin cover 8R having no protrusion 9. Main numerical values used in the simulation are as follows.

The sizes of the electronic control device 100 and 100R: 200 mm×120 mm
The sizes of fans 10: 50 mm×50 mm
The sizes of regions A: 50 mm×63 mm (path length LA: 63 mm)
The sizes of regions B: 50 mm×143 mm (path length LB: 143 mm)
Gaps between fins 6: 5.0 mm
Thicknesses of the fins 6: 2.0 mm
Heights of the fins 6: 14 mm (in the case of the electronic control device 100), 15 mm (in the case of the electronic control device 100R)

| | |
|---|---|
| 1.5 mm | 9a |
| 2.0 mm | 9b |

In this case, in the simulation using Equations 130, 131, and 132, the pressure loss ($\Delta P_{loss}$) was calculated using the numerical values illustrated in FIG. 17.

FIG. 16 illustrates a cross-sectional view of the region A, a cross-sectional view of the region B, and a pressure loss ($\Delta P_{loss}$) between the fins in each of the electronic control device 100R according to the comparative example and the electronic control device 100 according to the embodiment. In FIG. 16, the pressure loss $\Delta P_{loss}$ is simply expressed as $\Delta P$.

As can be seen from the cross-sectional views of the region A and the region B, the electronic control device 100R according to the comparative example illustrated in FIG. 16 has a configuration in which the fin cover 8R is not provided with a protrusion 9. As results of the simulation, the pressure loss in the region A is 5.8 Pa, and the pressure loss in the region B is 13.2 Pa. Therefore, the pressure loss (13.2 Pa) in the region B is about 2.3 times as large as the pressure loss (5.8 Pa) in the region A, and the difference between the pressure losses is relatively large. Therefore, the flow rate of cooling air in the region A is high, and the flow rate of cooling air in the region B is low. Therefore, heat of an electronic component 4a in the region A is efficiently dissipated, but heat of an electronic component 4b in the region B cannot be efficiently dissipated. That is, unevenness in heat dissipation occurs between the electronic component 4a in the region A and the electronic component 4b in the region B.

Meanwhile, in the electronic control device 100 according to the embodiment illustrated in FIG. 16, as can be seen from the cross-sectional views of the region A and the region B, the fin cover 8 is provided with the protrusions 9 in the region A, and is not provided with a protrusion 9 in the region B. As results of the simulation, the pressure loss in the region A is 15.3 Pa, and the pressure loss in the region B is 13.2 Pa. Therefore, the pressure loss (13.2 Pa) in the region B is about 0.9 times the pressure loss (15.3 Pa) in the region A, and the difference between the pressure losses is relatively small. Therefore, the flow rate of the cooling air in the region A is lower than the flow rate of the cooling air in the region A in the comparative example, but the flow rate of the cooling air in the region B is higher than the flow rate of the cooling air in the region B in the comparative example. For this reason, heat of both of the electronic components 4a and 4b in the region A is efficiently dissipated without occurrence of unevenness in heat dissipation. That is, the electronic control device 100 according to the embodiment is configured to be able to simultaneously dissipate heat from the plurality of electronic components 4a and 4b by one fan 10 by controlling the pressure losses in the inter-fin flow paths between the fins 9.

(Modifications)

Next, modifications will be described.

(Modification 1)

Figure 11:
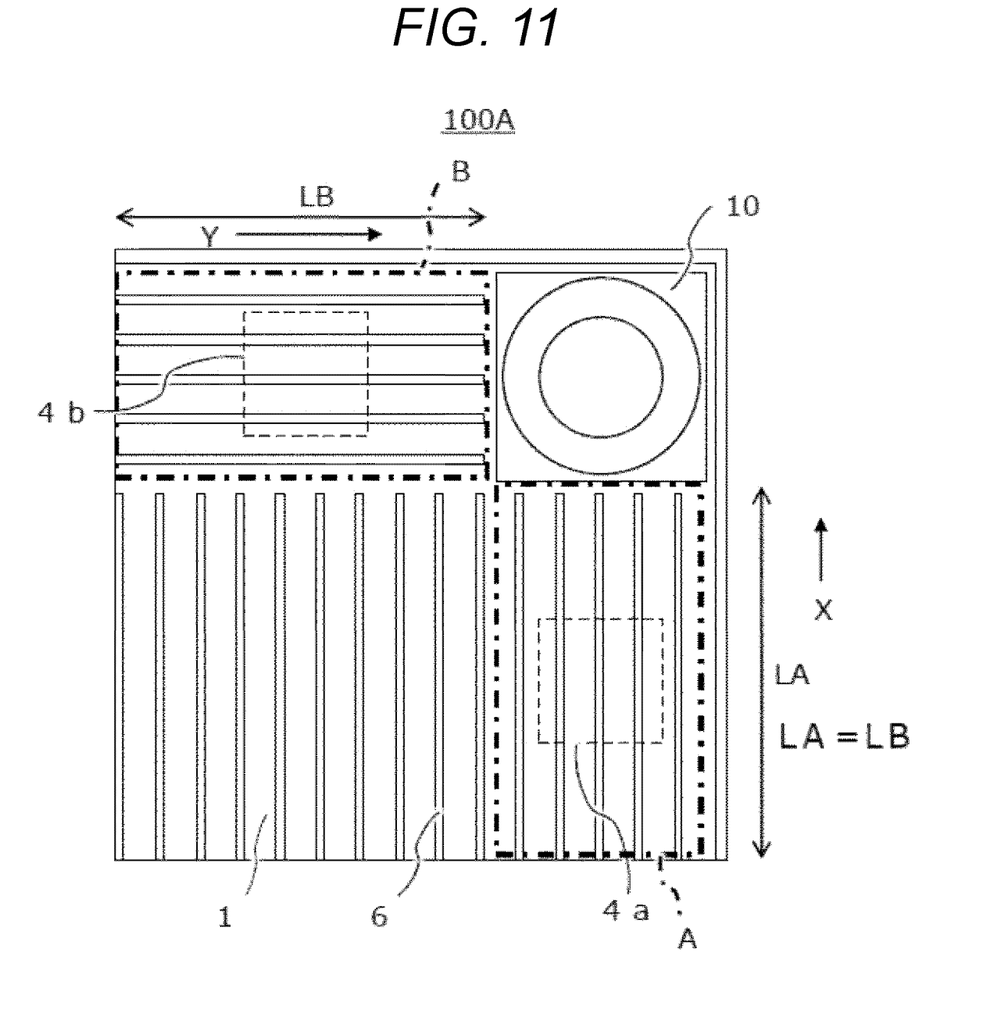
FIG. 11 is a top view of an electronic control device according to Modification 1.

FIG. 11 is a top view of an electronic control device according to Modification 1.

The shape of the electronic control device 100 in top view is not limited to a rectangular shape such as a rectangle as illustrated in FIGS. 1 to 3. As illustrated in FIG. 11, the shape of the electronic control device 100A in top view may be a rectangular shape such as a square. That is, a distance LA in the first flow path direction X and a distance LY in the second flow path direction Y may be equal (LA=LB). In this case, an electronic component 4a has a low heating value, and an electronic component 4b has a higher heating value than the heating value of the electronic component 4a. Although not illustrated, a plurality of protrusions (9 or 94) are disposed on a portion of a fin cover 8 corresponding to the region A as described in the embodiment.

In the electronic control device 100A provided with the electronic component 4a having a low heating value and the electronic component 4b having a high heating value, it is possible to simultaneously dissipate heat from the electronic components 4a and 4b while preventing unevenness in heat dissipation by one cooling fan 10.

(Modification 2)

Figure 12:
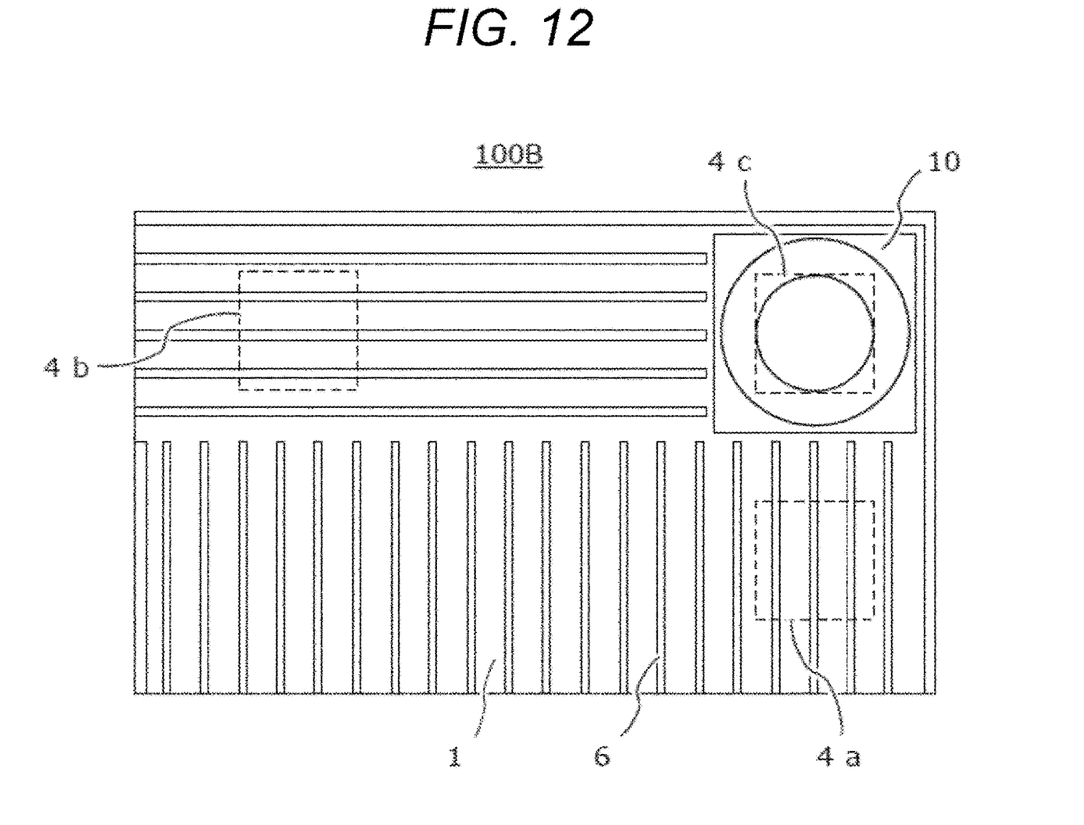
FIG. 12 is a top view of an electronic control device according to Modification 2.

FIG. 12 is a top view of an electronic control device according to Modification 2.

The number of electronic components mounted on the electronic control device 100 is not limited to two of the electronic components 4a and 4b. As indicated by the electronic control device 100B in FIG. 12, three electronic components 4a, 4b, and 4c may be provided. FIG. 12 is different from FIG. 3 in that the third electronic component 4c is mounted in a region below a cooling fan 10 in the electronic control device 100B illustrated in FIG. 12. In this case, a heating value of the third electronic component 4c is higher than heating values of the electronic components 4a and 4b. The lower side of the cooling fan 10 is a region having excellent heat dissipation, and thus is optimal as a place where the third electronic component 4c having a high heating value is mounted. One cooling fan 10 can simultaneously dissipate heat from the three electronic components 4a, 4b, and 4c while preventing unevenness in the heat dissipation.

(Modification 3)

In the above description, the tips of the plurality of fins 6 formed in the upper housing 1 are drawn to be separated from the fin cover 8, but the present invention is not limited thereto. The tips of the plurality of fins 6 formed in the upper housing 1 may be configured to be in contact with the fin cover 8 at least at one place or over the entire surface. According to this configuration, as heat dissipation paths of the electronic components 4a and 4b, a second heat dissipation path by the fins 6 and the fin cover 8 can be added to a first heat dissipation path by the cooling air. As a result, the heat of the electronic components 4a and 4b can be efficiently dissipated by the first and second heat dissipation paths.

(Modification 4)

In the above description, the case where the refrigerant is air (air cooling) has been described, but the present invention is not limited thereto. The refrigerant may be water (water cooled).

Although the invention made by the present inventor has been specifically described based on the embodiments, the present invention is not limited to the embodiments and examples, and it goes without saying that various modifications can be made without departing from the gist of the invention.

REFERENCE SIGNS LIST 100 electronic control device
A region A
B region B
1 upper housing (cooling mechanism)
1A base surface of upper housing
2 lower housing
3 circuit board
4a first electronic component
4b second electronic component
4c third electronic component
5 heat transfer material
6 heat dissipation fin
7 boss
8 fin cover
9 protrusion with protruding shape in fin cover
9a length of gap between protruding tip and root of heat dissipation fin
9b length of gap between protruding side surface and side surface of fin
10 fan
20 housing

The invention claimed is:

1. An electronic control device comprising:
a housing including a fin;
a cooling mechanism including a fin cover disposed over the fin to form a flow path for a refrigerant; and
a refrigerant circulation device configured to circulate the refrigerant through the flow path, wherein;
a first electronic component and a second electronic component are in contact with a base surface of the housing via a heat transfer member on a circuit board in the housing,
the housing includes a region A having the first electronic component and a region B having the second electronic component,
the flow path and the fin in the region A are disposed along a first direction,
the flow path and the fin in the region B are disposed along a second direction that intersects the first direction,
the region A and the refrigerant-circulation device are arranged along the first direction,
the region B and the refrigerant-circulation device are arranged along the second direction
the flow path is longer in the region B than in the region A,
the fin cover has a protrusion having a protruding shape on an inner side of the fin cover in the region A, an inner side of the fin cover in the region B has no protrusion having the protruding shape, and the flow path is formed in a comb-teeth shape.

2. The electronic control device according to claim 1, wherein in a cross section of a flow path in the region A, a gap between a root of the fin and a tip of the protrusion having the protruding shape is larger than a gap between a side surface of the fin parallel to a direction of the flow path and a side surface of the protrusion having the protruding shape.

3. The electronic control device according to claim 2, wherein a flow path disposed on an upper side of the first electronic component between the root of the fin and a tip of a protrusion having the protruding shape on the fin cover in the region A is larger than a flow path disposed at a position away from the upper side of the first electronic component between the root of the fin and a tip of a protrusion having the protruding shape on the fin cover in the region A.

4. The electronic control device according to claim 3, wherein the protrusion having the protruding shape on the fin cover and formed in each flow path in the region A is formed in at least a region where the first electronic component is disposed as viewed from above.

5. The electronic control device according to claim 1, wherein the flow path of the housing in the region A is equal to the flow path of the housing in the region B, and a heating value of the second electronic component is higher than a heating value of the first electronic component.

6. The electronic control device according to claim 1, wherein the fin cover is in contact with a tip of the fin of the housing at least at one location.

7. The electronic control device according to claim 1, wherein the housing has a forced air cooling structure including an air cooling fan.

8. The electronic control device according to claim 7, wherein the housing includes a third electronic component located immediately below the air cooling fan, and a heating value of the third electronic component is higher than heating values of the first electronic component and the second electronic component.

9. The electronic control device according to claim 1, wherein the fin cover is made of metal or a resin material.

10. An electronic control device comprising:
a first electronic component;
a second electronic component;
an upper housing having a base surface and a plurality of fins disposed on an upper side of the base surface;
a fin cover provided to cover an upper side of the plurality of fins of the upper housing; and
a housing including a first region having a plurality of first flow paths through which a refrigerant for cooling the first electronic component flows, and a second region having a plurality of second flow paths through which a refrigerant for cooling the second electronic component flows; and
a refrigerant circulation device configured to circulate the refrigerant through the plurality of first flow paths and the plurality of second flow paths, wherein:
the plurality of first flow paths and the plurality of fins in the first region are disposed along a first direction,
the plurality of second flow paths and the plurality of fins in the second region are disposed along a second direction that intersects the first direction,
the first region and the refrigerant circulation device are arranged along the first direction,
the second region and the refrigerant circulation device are arranged along the second direction,
the fin cover has a lower surface and a plurality of protrusions provided so as to correspond to a region of the lower surface on an upper side of the first electronic component, and
each of cross sections of the plurality of first flow paths is configured by a pair of fins among the plurality of fins, the base surface, the lower surface of the fin cover, and one of the plurality of protrusions, and
each of cross sections of the plurality of second flow paths is configured by a pair of fins among the plurality of fins, the base surface, and the lower surface of the fin cover.

11. The electronic control device according to claim 10, wherein path lengths of the plurality of first flow paths are shorter than or equal to path lengths of the plurality of second flow paths.

12. The electronic control device according to claim 10, wherein a length of each of the plurality of protrusions is equal to or shorter than lengths of the plurality of fins constituting the plurality of first flow paths.

13. The electronic control device according to claim 10, wherein gaps between roots of the plurality of fins and tips of the plurality of protrusions are larger than gaps between side surfaces of the plurality of fins parallel to a flow path direction of the refrigerant and side surfaces of the plurality of protrusions in a cross section of each flow path in the first region.

14. The electronic control device according to claim 10, wherein a flow path that is among the plurality of first flow paths and disposed on an upper side of the first electronic component between a root of the fin and a tip of the protrusion among the plurality of protrusions of the plurality of fins cover is larger than a flow path that is among the plurality of first flow paths and disposed at a position away from the upper side of the first electronic component between a root of the plurality of fins and a tip of the protrusion among the plurality of protrusions of the fin cover.

15. The electronic control device according to claim 10, further comprising a fan for causing air to flow as the refrigerant to the plurality of first flow paths and the plurality of second flow paths.

16. The electronic control device according to claim 15, wherein a heating value of the first electronic component is equal to or lower than a heating value of the second electronic component.

17. The electronic control device according to claim 15, wherein the housing includes a third electronic component in a region on a lower side of the fan, and a heating value of the third electronic component is higher than heating values of the first electronic component and the second electronic component.

18. The electronic control device according to claim 10, wherein the fin cover is in contact with tips of the plurality of fins at at least one location.

19. The electronic control device according to claim 10, wherein the fin cover is made of metal or a resin material.

* * * * *